United States Patent
Yang et al.

(10) Patent No.: US 9,269,664 B2
(45) Date of Patent: Feb. 23, 2016

(54) SEMICONDUCTOR PACKAGE WITH THROUGH SILICON VIA INTERCONNECT AND METHOD FOR FABRICATING THE SAME

(71) Applicant: MediaTek Inc., Hsin-Chu (TW)

(72) Inventors: Ming-Tzong Yang, Baoshan Township, Hsinchu County (TW); Cheng-Chou Hung, Hukou Township, Hsinchu County (TW); Yu-Hua Huang, Hsinchu (TW); Wei-Che Huang, Zhudong Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 13/846,138

(22) Filed: Mar. 18, 2013

(65) Prior Publication Data

US 2013/0264676 A1 Oct. 10, 2013

Related U.S. Application Data

(60) Provisional application No. 61/622,313, filed on Apr. 10, 2012, provisional application No. 61/750,048, filed on Jan. 8, 2013.

(51) Int. Cl.
*H01L 23/522* (2006.01)
*H01L 21/768* (2006.01)
*H01L 23/48* (2006.01)

(52) U.S. Cl.
CPC ...... *H01L 23/5226* (2013.01); *H01L 21/76898* (2013.01); *H01L 23/481* (2013.01); *H01L 2224/0401* (2013.01); *H01L 2224/0557* (2013.01); *H01L 2224/13025* (2013.01); *H01L 2924/00014* (2013.01)

(58) Field of Classification Search
CPC ............. H01L 21/76898; H01L 2924/00014; H01L 2224/05552; H01L 2224/0557; H01L 2224/13025; H01L 23/481; H01L 23/5226
USPC ................. 257/774, 621, E23.011, E21.597, 257/E23.067
See application file for complete search history.

(56) References Cited

U.S. PATENT DOCUMENTS 3,846,193 A * 11/1974 Jacobus et al. ..................... 38/34
7,525,186 B2 * 4/2009 Kim et al. ..................... 257/686
(Continued)

FOREIGN PATENT DOCUMENTS

KR    20110006946 A    1/2011
TW    200921815       5/2009
(Continued)

OTHER PUBLICATIONS

English Abstract translation of TW200921815 (Published May 16, 2009).

*Primary Examiner* — Marvin Payen
*Assistant Examiner* — Victor Barzykin
(74) *Attorney, Agent, or Firm* — McClure, Qualey & Rodack, LLP (57) ABSTRACT

The invention provides a semiconductor package with a through silicon via (TSV) interconnect and a method for fabricating the same. An exemplary embodiment of the semiconductor package with a TSV interconnect includes a semiconductor substrate. A through hole is formed through the semiconductor substrate. A TSV interconnect is disposed in a through hole. A conductive layer lines a sidewall of the through hole, surrounding the TSV interconnect.

12 Claims, 8 Drawing Sheets

(56) References Cited

U.S. PATENT DOCUMENTS

| | | | |
|---|---|---|---|
| 7,683,458 B2* | 3/2010 | Akram et al. | 257/621 |
| 7,691,747 B2 | 4/2010 | Lin et al. | |
| 7,745,883 B2* | 6/2010 | Williams et al. | 257/371 |
| 2006/0043509 A1* | 3/2006 | Watkins et al. | 257/431 |
| 2006/0043599 A1 | 3/2006 | Akram et al. | |
| 2008/0283959 A1* | 11/2008 | Chen et al. | 257/508 |
| 2010/0144135 A1* | 6/2010 | Kwon et al. | 438/597 |
| 2010/0297844 A1 | 11/2010 | Yelehanka et al. | |
| 2011/0304010 A1* | 12/2011 | Jiang et al. | 257/528 |
| 2012/0061795 A1* | 3/2012 | Yen et al. | 257/516 |
| 2013/0140708 A1* | 6/2013 | Lin et al. | 257/774 |
| 2013/0154048 A1* | 6/2013 | Lu et al. | 257/496 |
| 2013/0168832 A1* | 7/2013 | Endo | 257/621 |

FOREIGN PATENT DOCUMENTS

| | | |
|---|---|---|
| TW | 201104796 | 2/2011 |
| TW | 201145495 | 12/2011 |

* cited by examiner

SEMICONDUCTOR PACKAGE WITH THROUGH SILICON VIA INTERCONNECT AND METHOD FOR FABRICATING THE SAME

CROSS REFERENCE TO RELATED APPLICATIONS

This application claims the benefit of U.S. Provisional Application No. 61/622,313, filed on Apr. 10, 2012, and U.S. Provisional Application No. 61/750,048, filed on Jan. 8, 2013, the entireties of which are incorporated by reference herein.

BACKGROUND OF THE INVENTION

1. Field of the Invention

The present invention relates to a semiconductor package with a through silicon via (TSV) interconnect and a method for fabricating the same, and in particular, to a noise coupling suppression structure for a semiconductor package with a through silicon via (TSV) interconnect and a method for fabricating the same.

2. Description of the Related Art

For electronics engineering, a through silicon via (TSV) is a vertical electrical connection which passes completely through a silicon wafer or die. A TSV is formed by high performance techniques, when compared to alternatives such as package-on-package. A TSV is used to create three-dimensional (3D) semiconductor packages and 3D integrated circuits. The density of the via of a TSV is substantially higher than alternatives as the length of connections thereby are shorter.

An insulating liner of the conventional TSV serves as a capacitor between the silicon wafer and the TSV via plug. In high speed applications (e.g. RF applications), the electrical impedance of the conventional TSVs are reduced due to the insulating liner. When high speed circuits (e.g. digital circuits) transmit signals, the signals are coupled from the high speed circuits to other nodes such as the TSVs of analog circuits. Thus, noise coupling effect occurs and interferes with the other sensitive circuits (e.g. analog circuits), affecting the overall performance of the semiconductor package, which requires a high clock rate and analog precision.

Thus, a novel noise coupling suppression structure for a semiconductor package with a TSV interconnect is desirable.

BRIEF SUMMARY OF THE INVENTION

A semiconductor package with a through silicon via (TSV) interconnect is provided. An exemplary embodiment of a semiconductor package with a through silicon via (TSV) interconnect includes a semiconductor substrate. A through hole is formed through the semiconductor substrate. A TSV interconnect is disposed in a through hole. A conductive layer lines a sidewall of the through hole, surrounding the TSV interconnect.

Another exemplary embodiment of a semiconductor package with a through silicon via (TSV) interconnect includes a semiconductor substrate. A TSV interconnect is disposed in a through hole. A conductive layer is between the TSV interconnect and the semiconductor substrate.

An exemplary embodiment of a method for fabricating a semiconductor package with a through silicon via (TSV) interconnect, comprising providing a semiconductor substrate having a front side and a back side. The semiconductor substrate comprises a guard ring doped region disposed in the semiconductor substrate, coupled to a ground terminal. A well region is disposed in the semiconductor substrate, wherein a boundary of the guard ring doped region is formed within the well region. An isolation region is disposed on the well region, surrounded by the guard ring doped region. A poly pattern is disposed directly on the isolation region. A first opening is formed through a portion of the semiconductor substrate from the back side of the semiconductor substrate. A conductive layer is conformably formed lining the back side of the semiconductor substrate, a sidewall and the bottom surface of the first opening. The conductive layer formed on the back side of the semiconductor substrate and on the bottom surface of the opening is removed until the isolation region is exposed to form a second opening. An insulating layer is conformably formed lining the back side of the semiconductor substrate, a sidewall and the bottom surface of the second opening. The insulating layer formed on the back side of the semiconductor substrate and on the bottom surface of the second opening is removed until the poly pattern is exposed, thereby forming a through hole. A conductive via plug is formed filled in the through hole, covering the insulating layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1:
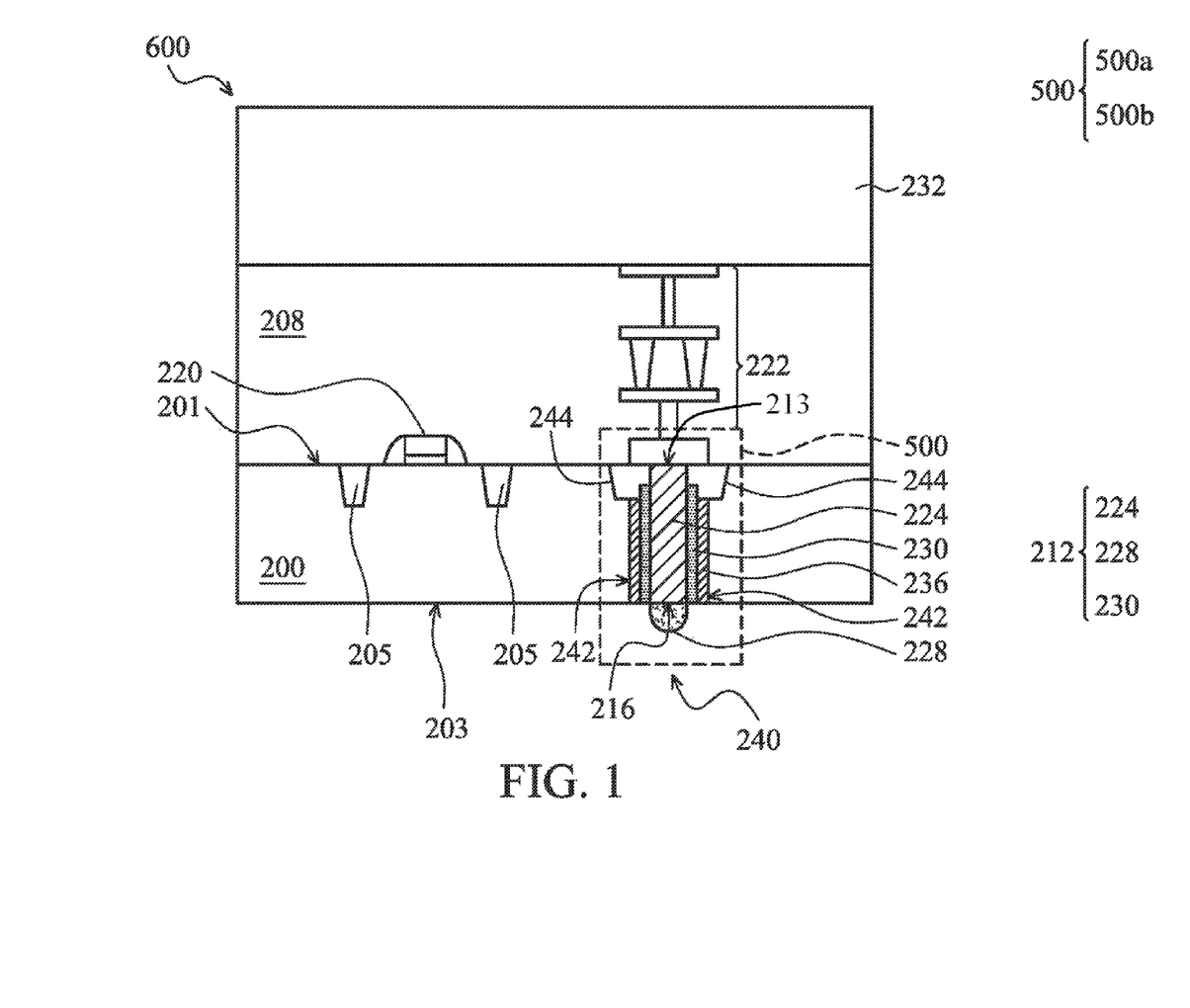
FIG. 1 is a cross section of one exemplary embodiment of a semiconductor package with a through silicon via (TSV) interconnect of the invention.

FIG. 1 is a cross section of one exemplary embodiment of a semiconductor package 600 with a through silicon via (TSV) interconnect 212 of the invention. In this embodiment, the semiconductor package 600 is fabricated by via last TSV technology. The TSV interconnect 212 is etched from a back side 203 of a semiconductor substrate 200. As shown in FIG. 1, the semiconductor package 600 comprises a semiconductor substrate 200 having a front side 201 and a back side 203 opposite to the front side 201. In one embodiment, the semiconductor substrate 200 may comprise silicon. In alternative embodiments, an SiGe, bulk semiconductor, strained semiconductor, compound semiconductor, silicon on insulator (SOI), and other commonly used semiconductor substrates can be used as the semiconductor substrate 200. The semiconductor substrate 200 may have a desired conductive type by implanting p-type or n-type impurities therein. An integrated circuit device 220, such as a transistor, is formed on the front side 201 of the semiconductor substrate 200. As shown in FIG. 1, the integrated circuit device 220 is isolated from the other devices (not shown) by shallow trench isolation (STI) features 205 formed in the semiconductor substrate 200. An interconnect structure 222 is formed on the front side 201 of the semiconductor substrate 200, in a dielectric layer laminating structure 208. In one embodiment, the interconnect structure 222 electrically connects to the integrated circuit device 220. In one embodiment, the interconnect structure 222 may be constructed by contacts, via and metal layer patterns, and the metal layer patterns are disposed vertically between the contacts and via and/or vias in different layer levels. The number of metal layer patterns is defined by design for the integrated circuit device 220 and the scope of the invention is not limited thereto. Also, a passivation layer 232 is entirely formed covering the dielectric layer laminating structure 208.

A through hole 240 is formed through the semiconductor substrate 200. Also, the through hole 240 is formed through an isolation region 244 formed in the semiconductor substrate 200. In this embodiment, the isolation region 244 may serve as a STI feature 244. In this embodiment, a poly pattern 226 is design to be disposed directly on the STI feature 244, within a boundary of the STI feature 244. As shown in FIG. 1, a portion of the poly pattern 226 is exposed to the through hole 240. In one embodiment, the through hole 240 is formed by a laser drilling process performed on the front side 201 of the semiconductor substrate 200. In one embodiment, the through hole 240 defines a formation position of a subsequently formed TSV structure 212. Further, for noise coupling suppression of the subsequently formed TSV structure 212, a conductive layer 236 is formed to partially line a sidewall 242 of the through hole 240 by a deposition process and a subsequently performed etching process before the formation of the subsequently formed TSV structure 212. In one embodiment, the conductive layer 236 may comprise Ti, TiN, W or polysilicon.

An insulating layer 230 is conformably formed is formed to partially line a sidewall 242 of the through hole 240, covering the conductive layer 236.

A conductive via plug 224 is filled in the through hole 240, covering the insulating layer 230 by a photolithography, plating and patterning process. In one embodiment, the conductive via plug 224 is formed of aluminum (Al) or copper (Cu). It is noted that a terminal 213 of the conductive via plug 224 aligned to the front side 201 is connected to a bottom of the poly pattern 226 above the STI feature 244.

A conductive bump 228 is formed on the terminal 216 of the conductive via plug 224 aligned to the back side 203 by a bumping process. In one embodiment, the conductive bump 228 may comprise a solder bump.

As shown in FIG. 1, a TSV interconnect 212, which comprises the conductive via plug 224, the conductive bump 228 and the insulating layer 230, is formed through the semiconductor substrate 200, electrically connected to the interconnect structure 222 through the poly pattern 226.

Figure 2:
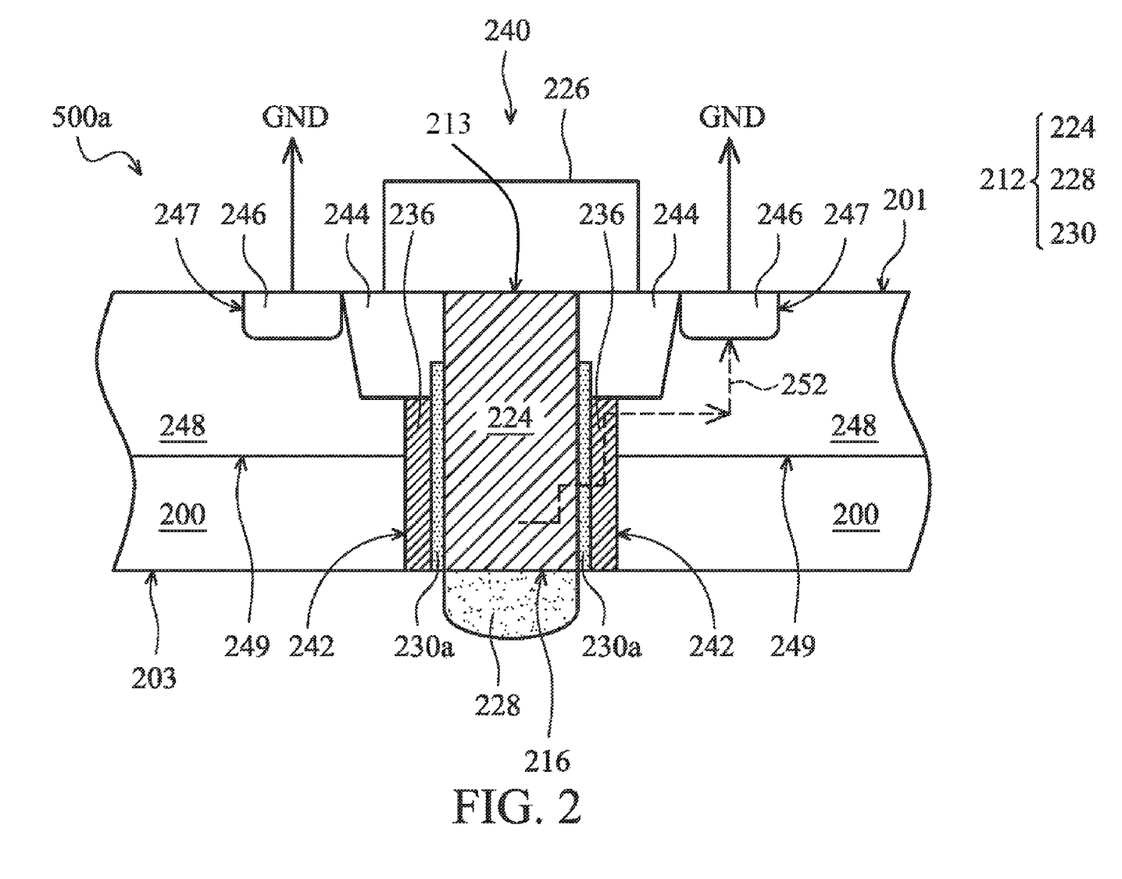
FIG. 2 is an enlarged view of a portion of FIG. 1, showing of one exemplary embodiment of a noise coupling suppression structure for a semiconductor package with a through silicon via (TSV) interconnect of the invention.

It is noted that the conductive layer 236, which is formed lining the sidewall 242 of the through hole 240 and surrounding the TSV interconnect 212, is used to reduce the noise coupling of the substrate which while the TSV interconnect 212 is used to transmit the speed signals. The conductive layer 236 is used to reduce the noise coupling of the substrate which occurs not only close to a surface of the semiconductor substrate 200, but also close to a deeper region of the of the semiconductor substrate 200. Alternatively, the conductive layer 236 may be designed to connect with a guard ring coupled to a ground terminal (GND) for further noise suppression. FIG. 2 is an enlarged view of a portion 500 of FIG. 1, showing one exemplary embodiment of a noise coupling suppression structure 500*a* for a semiconductor package with a through silicon via (TSV) interconnect of the invention. As shown in FIG. 2, in one embodiment, the noise coupling suppression structure 500*a* is disposed surrounding the TSV interconnect 212. In one embodiment as shown in FIG. 2, the noise coupling suppression structure 500*a* may comprise the conductive layer 236 partially lining the sidewall 242 of the through hole 240, surrounding the TSV interconnect 212. It is noted that the conductive layer 236 is connected to a bottom of the STI feature 244, without formed through the STI feature 244 and the poly pattern 226 above the STI feature 244. The conductive layer 236 covers a portion of the insulating layer 230 as shown in FIG. 1. It is noted that the insulating layer 230 is formed through a portion of the STI feature 244 from the bottom thereof. As shown in FIG. 2, the noise coupling suppression structure 500*a* may comprise a conductive layer 236, a guard ring doped region 246 and a well region 248 disposed in the semiconductor substrate 200. In one embodiment, a boundary 247 of the guard ring doped region 246 is within a boundary 249 of the well region 248. In one embodiment as shown in FIG. 2, a conductive type of the guard ring doped region 246 of the noise coupling suppression structure 500*a* is different from that of the well region 248, but the same as that of the semiconductor substrate. For example, if the semiconductor substrate 200 is P-type, then the guard ring doped region 246 is P-type, and the well region 248 is N-type. For example, if the guard ring doped region 246 is a P-type heavily (P+) doped region, then the well region 248 is a deep N-type well region (DNW). Therefore, the guard ring doped region 246 and the well region 248 may be constructed as a P-N junction.

As shown in FIG. 2, the noise coupling suppression structure 500*a* may further comprise a STI feature 244 disposed on the well region 248, between the sidewall 242 of the through hole 240 and the guard ring doped region 246. The STI feature 244 is used to separate the guard ring doped region 246 and the conductive layer 236, so that noise coupling from the semiconductor substrate 200 or the TSV interconnect 212 can be transmitted to the ground terminal GND sequentially through the conductive layer 236, the well region 248 and the guard ring doped region 246. For example, the noise coupling from the TSV interconnect 212 can be transmitted to the ground terminal GND through the conductive layer 236, the well region 248 and the guard ring doped region 246 (see an arrow 252).

Figure 3A:
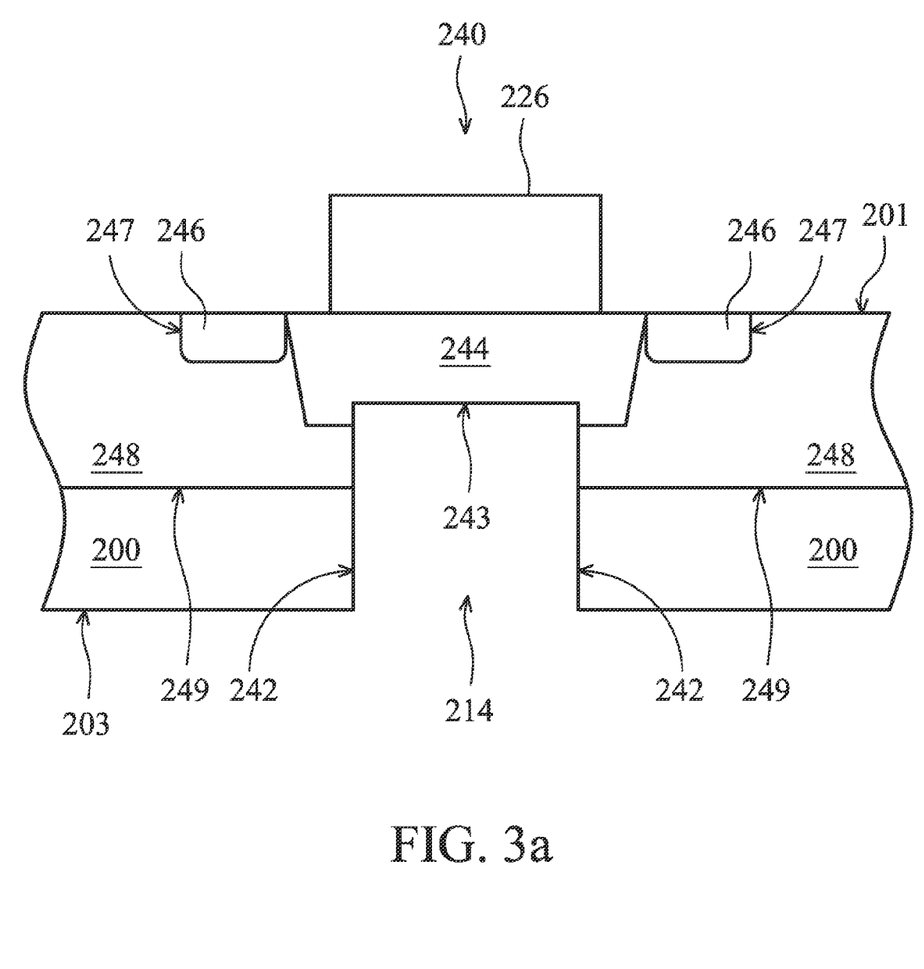
FIGS. 3a-3e are cross sections showing one exemplary embodiment of a noise coupling suppression structure for a semiconductor package with a through silicon via (TSV) interconnect of the invention.

FIGS. 3*a*-3*e* are cross sections showing one exemplary embodiment of a method for fabricating a noise coupling suppression structure (e.g. the noise coupling suppression structure 500*a* as shown in FIG. 2) for a semiconductor package with a through silicon via (TSV) interconnect 212 of the invention. As shown in FIG. 3*a*, a semiconductor substrate 200 is provided. In this embodiment, STI features (e.g. the STI feature 205 and 244 as shown in FIG. 1) may be formed in the semiconductor substrate 200, and an integrated circuit device (e.g. the integrated circuit device 220 as shown in FIG. 1) may be formed on the front side 201 of the semiconductor substrate 200. Also, a dielectric layer laminating structure (e.g. the dielectric layer laminating structure 208 as shown in FIG. 1) may be formed on the front side 201 of the semiconductor substrate 200, covering the integrated circuit device. Further, an interconnect structure (e.g. the interconnect structure 222 as shown in FIG. 1) may be formed on the front side 201 of the semiconductor substrate 200, in the dielectric layer laminating structure. Moreover, a passivation layer (e.g. the passivation layer 232 as shown in FIG. 1) may be entirely formed covering the dielectric layer laminating structure 208. It is noted that the method requires a STI feature 244 formed in the semiconductor substrate 200, and a poly pattern 226 formed directly on the STI feature 244 to be collectively used as an etch stop structure for the subsequence TSV interconnect 212 with a noise coupling suppression structure 500a as shown in FIG. 1.

Next, a thinning process may be performed to the semiconductor substrate 200 from the back side 203 of the semiconductor substrate 200 to reduce a thickness of the semiconductor substrate 200. After performing the thinning process, a photolithography process and a following anisotropic etching process are performed from the back side 203 of the semiconductor substrate 200 until a bottom of the STI feature 244 is exposed. Therefore, an opening 214 is formed through a portion of the semiconductor substrate 200. In this embodiment, the STI feature 244 may serve as an etch stop feature for the anisotropic etching process. The opening 214 is formed directly under the STI feature 244, and a bottom of the STI feature 244 is exposed to a bottom surface 243 of the opening 214. In one embodiment, the opening 214 is formed within a boundary of the STI feature 244 in a top view. In one embodiment, the opening 214 may be formed through a portion of the STI feature 244.

Figure 3B:
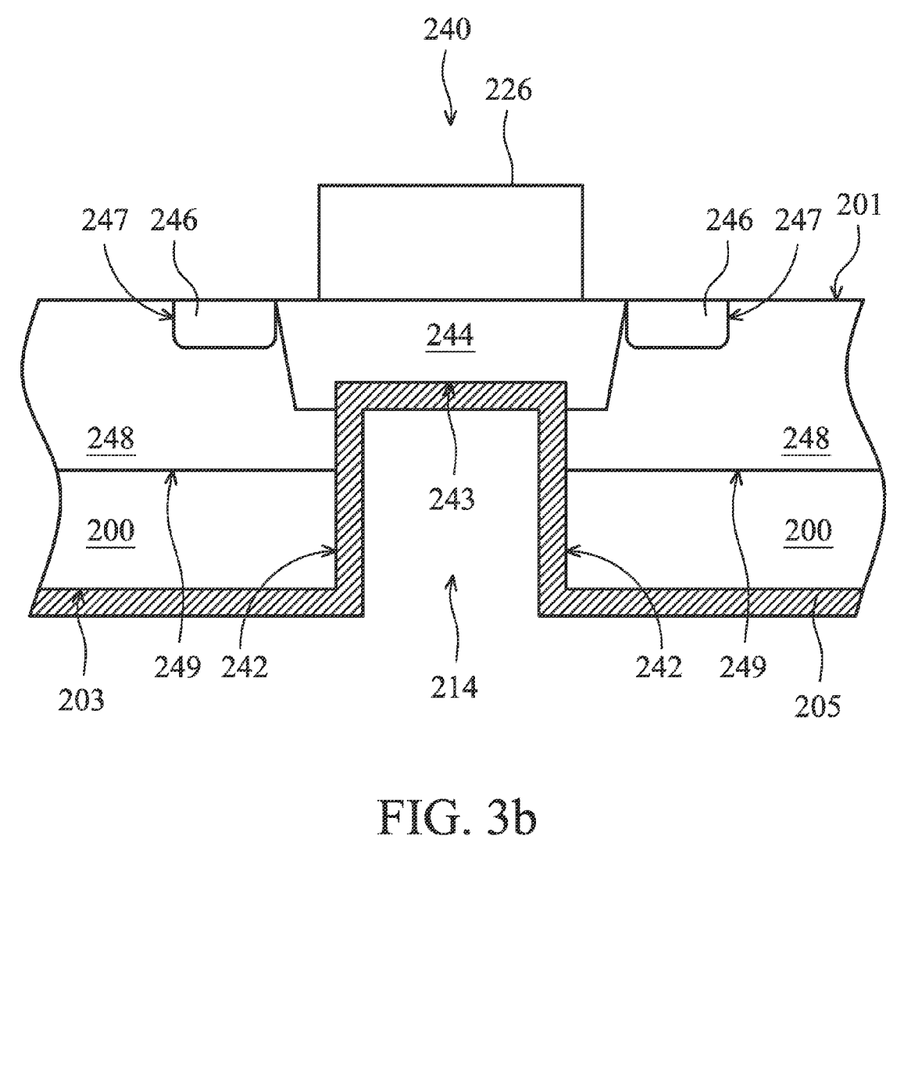

Next, as shown in FIG. 3b, a deposition process is performed from the back side 203 of the semiconductor substrate 200 to conformably form a conductive layer 235. In one embodiment, the conductive layer 235 lines the back side 203 of the semiconductor substrate 200, a sidewall 242 and the bottom surface 243 of the opening 214. In one embodiment, the conductive layer 235 may comprise Ti, TiN, W or poly-silicon.

Figure 3C:
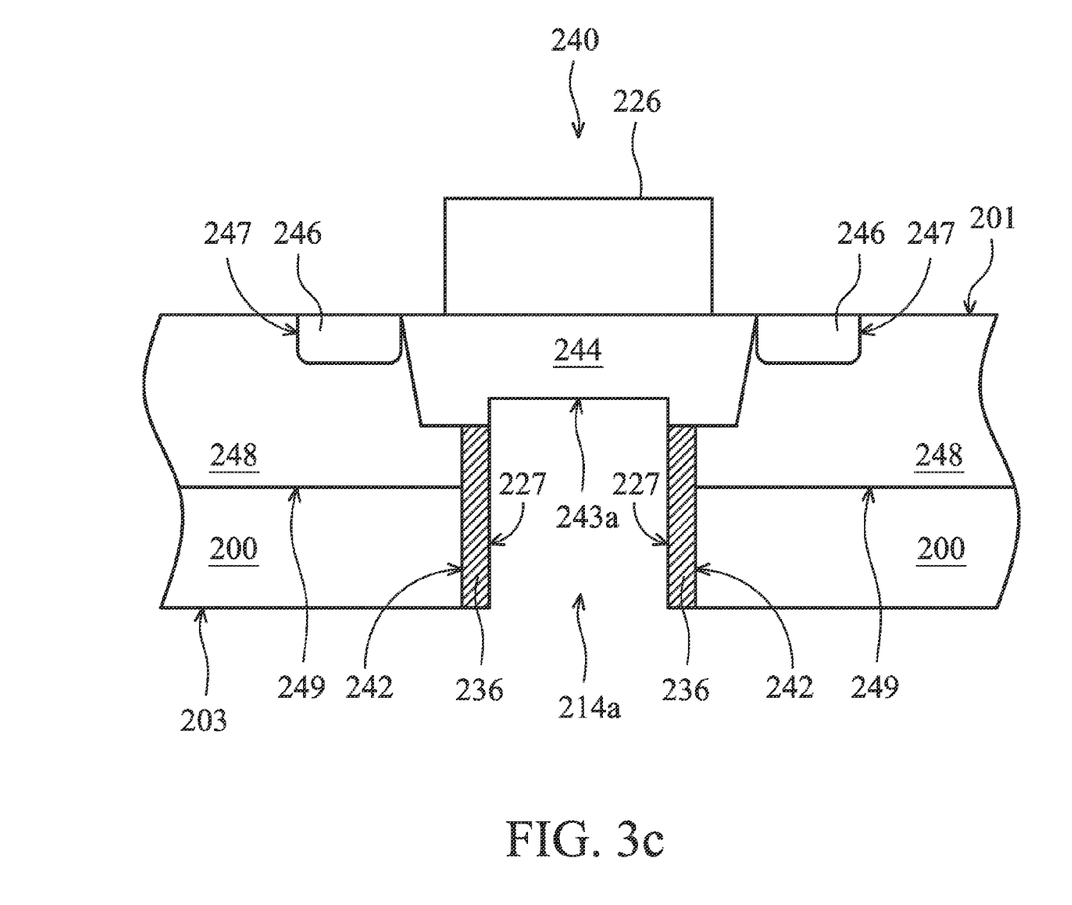

Next, as shown in FIG. 3c, an etching back process is performed from the back side 203 of the semiconductor substrate 200 to remove the conductive layer 235 formed on the back side 203 of the semiconductor substrate 200 and on the bottom surface 243 of the opening 214 until the bottom of the STI feature 244 is exposed. Therefore, an opening 214a is formed with a depth larger than the opening 214 as shown in FIG. 3b. That is to say, a bottom surface 243a of the opening 214a is more close to the front side 201 of the semiconductor substrate 200 than the bottom surface 243 of the opening 214 as shown in FIG. 3b. After performing the etching back process, a conductive layer 236 is formed lining on a sidewall 227 of the opening 214a only. It is noted that an upper portion of the conductive layer 236 is surrounded by the well region 248. Further, the conductive layer 236 is separated from the guard ring doped region 246 by the STI feature 244.

Figure 3D:
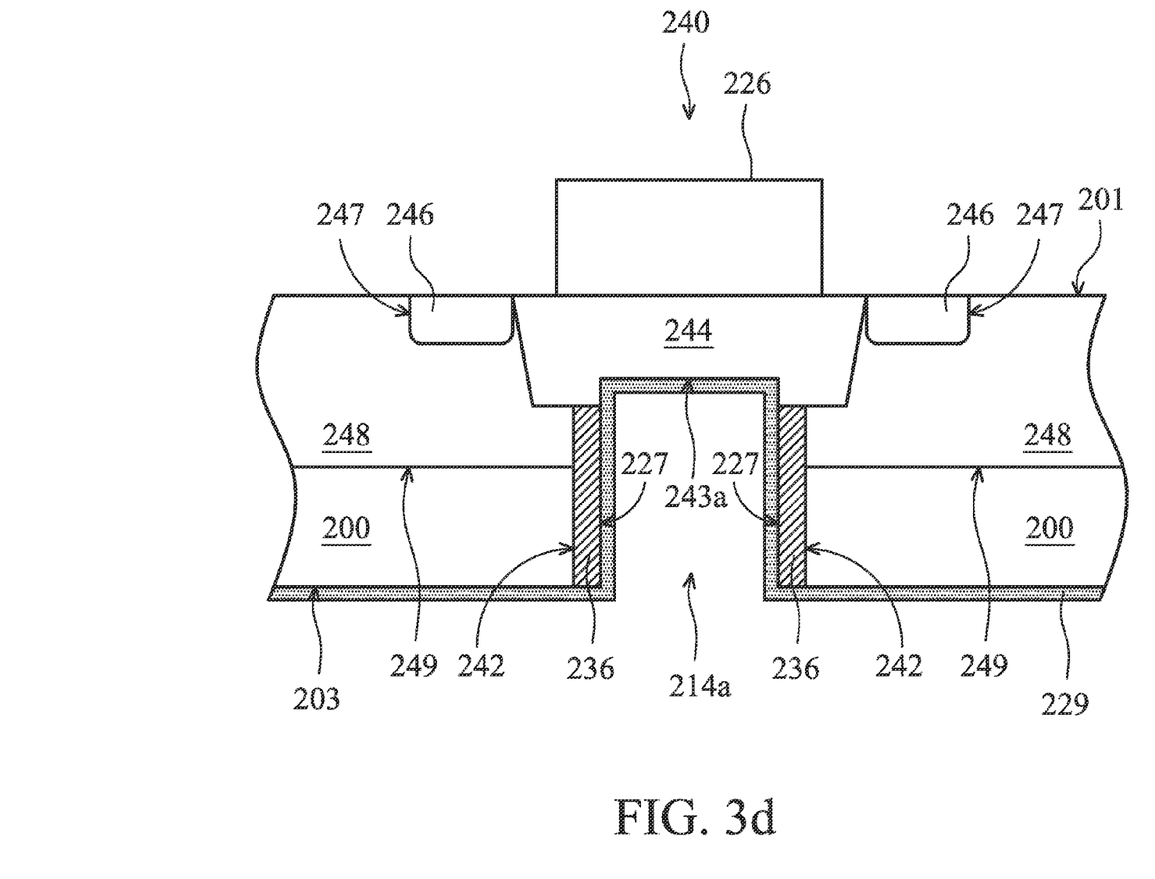

Next, as shown in FIG. 3d, another deposition process is performed from the back side 203 of the semiconductor substrate 200 to conformably form an insulating layer 229. In one embodiment, the insulating layer 229 lines the back side 203 of the semiconductor substrate 200, a sidewall 227 and the bottom surface 243a of the opening 214a. In one embodiment, the insulating layer 229 may comprise oxide.

Figure 3E:
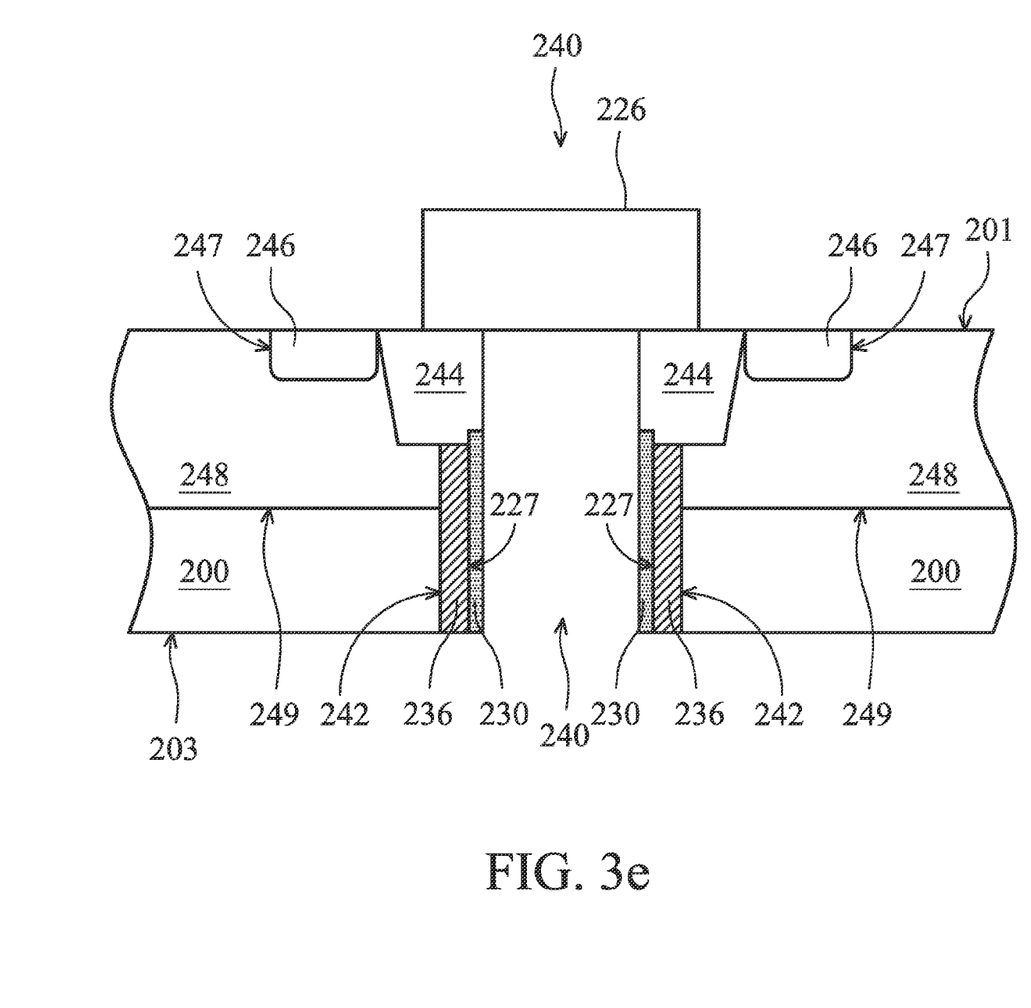

Next, as shown in FIG. 3e, an etching back process is performed from the back side 203 of the semiconductor substrate 200 to remove the insulating layer 229 formed on the back side 203 of the semiconductor substrate 200 and on the bottom surface 243a of the opening 214a. Also, the etching back process is performed to remove a portion of the STI feature until the poly pattern 226 is exposed. Therefore, the poly pattern 226 may serve as an etch stop feature for the etching back process as shown in FIG. 3e. After performing the etching back process, an opening 240 is formed through the semiconductor substrate 200 and the STI feature. That is to say, the opening 240 has a depth larger than the opening 214a as shown in FIG. 3d. After performing the etching back process, an insulating layer 230 is conformably formed is formed to partially line a sidewall 242 of the through hole 240, covering the conductive layer 236.

Next, refer to FIG. 2 again, a photolithography, plating and patterning process are sequentially performed from the back side 203 of the semiconductor substrate 200 to form a conductive via plug 224 filled in the through hole 240, covering the insulating layer 230. In one embodiment, the conductive via plug 224 is formed of aluminum (Al). The conductive via plug 224 has two terminals respectively aligned to a front side 201 and a back side 203 of the semiconductor substrate 200. It is noted that the terminal 213 of the conductive via plug 224 aligned to the front side 201 is connected to a bottom of the poly pattern 226 above the STI feature 244. Also, the conductive via plug 224 is separated from the conductive layer 236 by the insulating layer 230 and the STI feature 244.

Next, refer to FIG. 2 again, a bumping process is performed to form a conductive bump 228 on the terminal 216 of the conductive via plug 224 aligned to the back side 203 of the semiconductor substrate 200. In one embodiment, the conductive bump 228 may comprise a solder bump. After performing the aforementioned processes as shown in FIGS. 3a-3f, one exemplary embodiment of a noise coupling suppression structure 500a for a semiconductor package with a through silicon via (TSV) interconnect 212 of the invention is formed completely.

Figure 4:
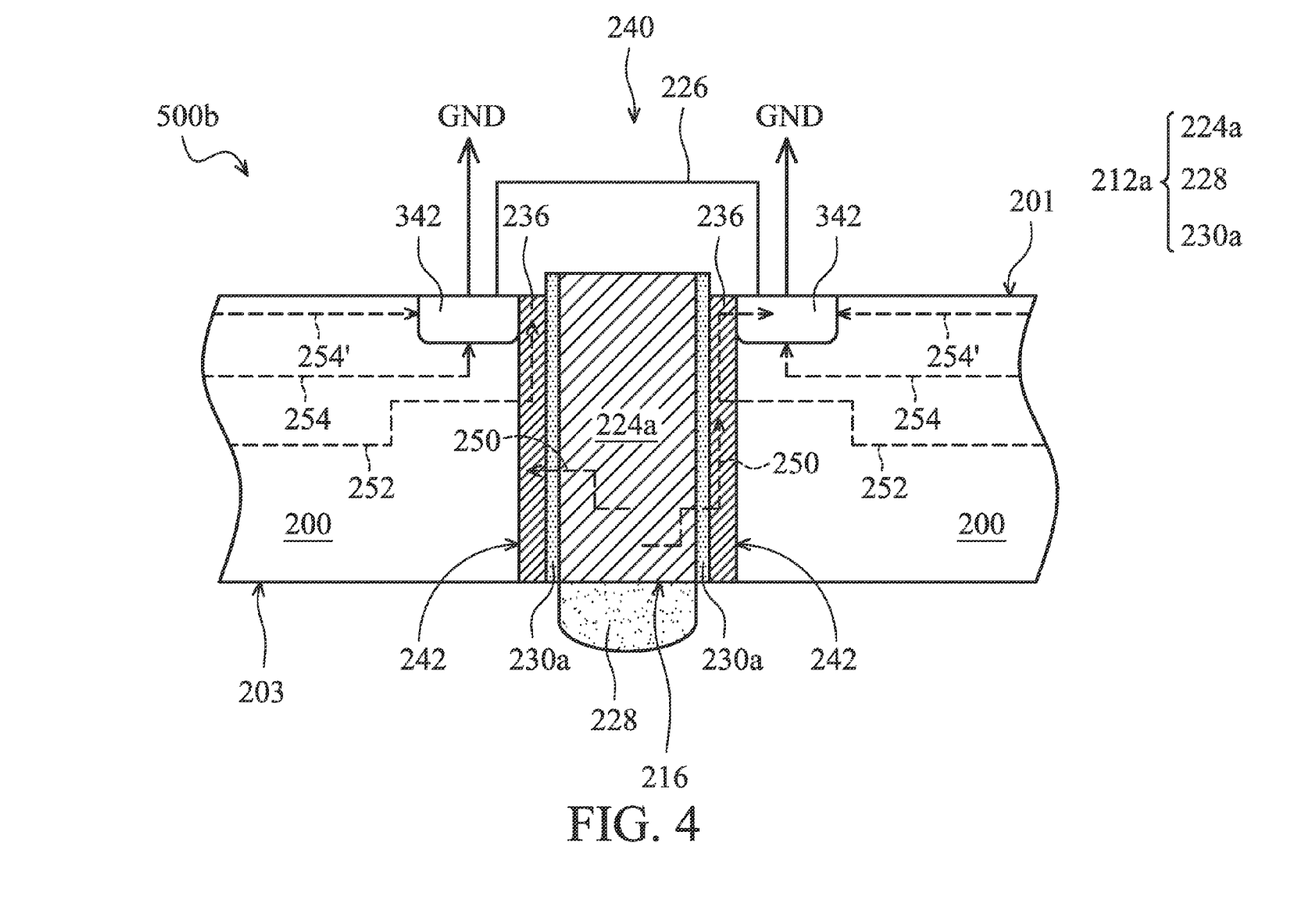
FIG. 4 is an enlarged view of a portion 500 of FIG. 1, showing another exemplary embodiment of a noise coupling suppression structure for a semiconductor package with a through silicon via (TSV) interconnect of the invention.

FIG. 4 is an enlarged view of a portion 500 of FIG. 1, showing another exemplary embodiment of a noise coupling suppression structure 500b for a semiconductor package with a through silicon via (TSV) interconnect 212a of the invention. One of differences between the noise coupling suppression structure 500b and the noise coupling suppression structure 500b is that the noise coupling suppression structure 500b comprises a poly pattern 226 serving as a single etch top feature for the subsequence noise coupling suppression structure 500b and the TSV interconnect 212a. Therefore, the TSV interconnect 212a is formed without passing through any STI feature. Another one of differences between the noise coupling suppression structure 500b and the noise coupling suppression structure 500b is that the noise coupling suppression structure 500b uses only one doped region, for example, a guard ring doped region 342, surrounding the TSV interconnect 212a for the noise transmission.

In one embodiment as shown in FIG. 4, the noise coupling suppression structure 500b comprises a poly pattern 226 disposed on the front side 201 of the semiconductor substrate 200. In one embodiment as shown in FIG. 4, the TSV interconnect 212a is formed through the semiconductor substrate 200, connecting a bottom of the poly pattern 226. That is to say the TSV interconnect 212a is disposed directly under the poly pattern 226. In one embodiment as shown in FIG. 4, TSV interconnect 212a has two terminals aligned to front side 201 and a back side 203 of the semiconductor substrate 200. In one embodiment as shown in FIG. 4, the noise coupling suppression structure 500b may comprise the conductive layer 236 fully lining the sidewall 242 of the through hole 240, surrounding the TSV interconnect 212a. In one embodiment, the TSV interconnect 212a may comprise an insulating layer 230a fully lining the sidewall 242 of the through hole 240, covering an inner sidewall of the conductive layer 236, a conductive via plug 224a filling the through hole 240, and a conductive bump bonding on a terminal of the conductive via plug 224a close to the back side 203 of the semiconductor substrate 200.

The noise coupling suppression structure 500b may further comprise a guard ring doped region 342 disposed in the semiconductor substrate 200, surrounding the conductive layer 236 and the sidewall 242 of the through hole 240. Also, the guard ring doped region 342 is adjacent to the conductive layer 236. In one embodiment, the guard ring doped region 342 may be formed by a doping process to implant dopants from the front side 201 of the semiconductor substrate 200. Therefore, the guard ring doped region 342 is close to the front side 201 of the semiconductor substrate 200. In one embodiment, the guard ring doped region 342 may be coupled to a ground terminal GND. Also, the conductive via plug 224a of the TSV interconnect 212a is separated from the conductive layer 236 by the insulating layer 230a.

In one embodiment as shown in FIG. 4, a conductive type of the guard ring doped region 342 of the noise coupling suppression structure 500b is the same as that of the semiconductor substrate 200. For example, if the semiconductor substrate 200 is P-type, and the guard ring doped region 342 is P-type.

As shown in FIG. 4, the formed conductive layer 236 can provide a conductive path, which is formed vertically through the semiconductor substrate 200, connecting to the guard ring doped region 342. Also, the conductive layer 236 has a resistance which is much lower than the guard ring doped region 342. The noise coupling from the semiconductor substrate 200 or the TSV interconnect 212 can be quickly transmitted to the ground terminal GND by the guard ring doped region 342 and the conductive layer 236 connected thereto. For example, the noise coupling from the semiconductor substrate 200 can be directly transmitted to the ground terminal GND through the guard ring doped region 342 (see an arrow 254) or through the conductive layer 236 and the guard ring doped region 342 (see an arrow 252). Also, the noise coupling from the TSV interconnect 212 can be transmitted to the ground terminal GND through the conductive layer 236 and the guard ring doped region 342 (see an arrow 250).

Embodiments provide a noise coupling suppression structure for a semiconductor package with a through silicon via (TSV) interconnect. In one embodiment, the noise coupling suppression structure may provide an additional conductive layer vertically between the semiconductor substrate and the TSV interconnect. The additional conductive layer is used to reduce the noise coupling of the substrate which occurs not only close to a surface of the semiconductor substrate, but also close to a deeper region of the of the semiconductor substrate. The noise coupling suppression structure may further comprise a guard ring doped region connecting to the additional conductive layer, coupled to a ground terminal GND. The noise coupling from the semiconductor substrate or the TSV interconnect can be quickly transmitted to the ground terminal GND through the guard ring doped region and the conductive layer vertically formed through the semiconductor substrate. Moreover, the noise coupling suppression structure can be applied to TSV technology without an additional circuit design flow.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package with a through silicon via (TSV) interconnect, comprising:
   a semiconductor substrate;
   a through hole formed through the semiconductor substrate;
   a TSV interconnect disposed in the through hole;
   a conductive layer disposed lining a sidewall of the through hole, surrounding the TSV interconnect;
   a guard ring doped region disposed in the semiconductor substrate, surrounding the sidewall of the through hole, wherein the guard ring doped region is coupled to a ground terminal;
   a well region disposed in the semiconductor substrate, wherein a boundary of the guard ring doped region is formed within the well region; and
   an isolation region disposed on the well region, between the sidewall of the through hole and the guard ring doped region, wherein the conductive layer is connected to a bottom of the isolation region.

2. The semiconductor package with TSV interconnects as claimed in claim 1, wherein the TSV interconnect comprises:
   a conductive via plug having two terminals aligned to a front side and a back side of the semiconductor substrate;
   an insulating layer surrounding the conductive via plug; and
   a conductive bump disposed on one of the two terminals of the conductive via plug aligned to the back side of the semiconductor substrate.

3. The semiconductor package with TSV interconnects as claimed in claim 2, wherein the conductive layer covers the insulating layer.

4. The semiconductor package with TSV interconnects as claimed in claim 1, wherein a conductive type of the guard ring doped region is the same as a conductive type of the semiconductor substrate.

5. The semiconductor package with TSV interconnects as claimed in claim 1, further comprising:
   a guard ring doped region disposed in the semiconductor substrate, surrounding the sidewall of the through hole, wherein the guard ring doped region is adjacent to the conductive layer.

6. The semiconductor package with TSV interconnects as claimed in claim 1, wherein a conductive type of the guard ring doped region is different from that of the well region.

7. The semiconductor package with TSV interconnects as claimed in claim 1, wherein a boundary of the isolation region is formed within the well region.

8. The semiconductor package with TSV interconnects as claimed in claim 1, wherein the conductive layer comprises Ti, TiN, W or polysilicon.

9. The semiconductor package with TSV interconnects as claimed in claim 1, further comprising a poly pattern disposed on the front side of the semiconductor substrate, wherein the terminal of the conductive via plug aligned to the front side is connected to a bottom of the poly pattern.

10. The semiconductor package with TSV interconnects as claimed in claim 1, further comprising a poly pattern disposed directly on the isolation region, wherein the terminal of the conductive via plug aligned to the front side is connected to a bottom of the poly pattern.

11. The semiconductor package with TSV interconnects as claimed in claim 1, wherein the insulating layer is formed through a portion of the isolation region from a bottom of the isolation region.

12. A semiconductor package with a through silicon via (TSV) interconnect, comprising:
- a semiconductor substrate;
- a TSV interconnect disposed in a through hole;
- a conductive layer between the TSV interconnect and the semiconductor substrate;
- a well region disposed in the semiconductor substrate;
- a guard ring doped region disposed in the semiconductor substrate and is coupled to a ground terminal, wherein a boundary of the guard ring doped region is formed within the well region; and
- an isolation region disposed on the well region, between the TSV interconnect and the guard ring doped region, wherein the conductive layer is connected to a bottom of the isolation region.

* * * * *